(12) United States Patent
Nishimura et al.

(10) Patent No.: US 6,617,097 B2
(45) Date of Patent: Sep. 9, 2003

(54) EXPOSURE METHOD

(75) Inventors: Yasunori Nishimura, Nara (JP); Taimi Oketani, Mie (JP); Tsuyoshi Naraki, Tokyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/747,910

(22) Filed: Dec. 22, 2000

(65) Prior Publication Data

US 2001/0006764 A1 Jul. 5, 2001

(30) Foreign Application Priority Data

Dec. 22, 1999 (JP) .......................................... 11-365004

(51) Int. Cl.⁷ ..................... G03C 5/56; G01B 11/02; G03B 27/42
(52) U.S. Cl. ......................... 430/322; 430/5; 430/17; 430/22; 430/30; 430/31; 355/53; 356/399; 356/400
(58) Field of Search .................. 430/5–17, 22–30, 430/311, 322; 355/53; 356/399–400

(56) References Cited

U.S. PATENT DOCUMENTS 5,471,279 A * 11/1995 Takizawa ..................... 269/21
5,526,093 A * 6/1996 Takahashi ..................... 355/53

FOREIGN PATENT DOCUMENTS

| JP | 08-167569 | 6/1996 | ......... H01L/21/027 |
| JP | 9-306826 | 11/1997 | |
| JP | 11-016820 | 1/1999 | ......... H01L/21/027 |

OTHER PUBLICATIONS

Copy of a Jul. 30, 2002 Office Action in connection with corresponding Korean Application, wherein the above–identified references "BA" and "BB" were cited in the office action.

* cited by examiner

Primary Examiner—Mark F. Huff
Assistant Examiner—Daborah Chacko-Davis
(74) Attorney, Agent, or Firm—Edwards & Angell, LLP; David G. Conlin, Esq.; Richard J. Roos, Esq.

(57) ABSTRACT

The present invention aims at reducing the number of scanning exposure and at enhancing throughput.

the above-mentioned objective is achieved by allowing a substrate 14 to be placed in sideways with respect to a substrate holder 15a (placing the longer sides of the substrate in parallel to the shorter sides of the substrate holder) depending on the size of the apparatus and the size of the substrate 14. It is acceptable even when areas other than an effective exposure area of the substrate 14 should project out from the substrate holder.

5 Claims, 9 Drawing Sheets

EXPOSURE METHOD

FIELD OF THE INVENTION

The present invention relates to an exposure method. More particularly, the present invention relates to an exposure method for exposing a flat substrate to a pattern for fabricating a liquid crystal display panel, a plasma display panel, and the like.

BACKGROUND OF THE INVENTION

Display qualities of recent liquid crystal display panels and plasma display panels are remarkably enhanced. Moreover, the liquid crystal display panels and the plasma display panels are thin and light, and thus are becoming major image display apparatuses as substitutes for CRTs. Particularly, a direct-view type active matrix liquid crystal panel is making progress in enlarging its screen size, and to that end the size of glass substrates used for fabricating the liquid crystal panels are becoming larger as well.

As an exposure method for exposing a large-sized glass substrate to element patterns of a display panel, a scanning-type exposure method is known. According to the scanning-type exposure method, exposure is performed by synchronously scanning a photomask or a reticle having a pattern formed thereon (hereinafter, referred to as a "mask") and a glass substrate applied with a photosensitive agent such as a photoresist (hereinafter, referred to as a "substrate").

As an example, scanning exposure of a substrate to a mask pattern at one to one magnification will be described. Assume that the size of an effective exposure area of the mask is 400 mm×700 mm, the size of the substrate is 720 mm×900 mm, and the size of a substrate holder for carrying the substrate is 843 mm×890 mm. A scanning-type exposure apparatus, which synchronously transfers a mask stage (for supporting and transporting a mask) and a substrate stage (a substrate holder for supporting a substrate) with respect to a projection optical system, is used to expose a substrate to a pattern of a 17-inch SXGA liquid crystal display panel. The size of the 17-inch SXGA panel including a circuit pattern surrounding a pixel region is 279.7 mm×347.2 mm.

Figure 7:
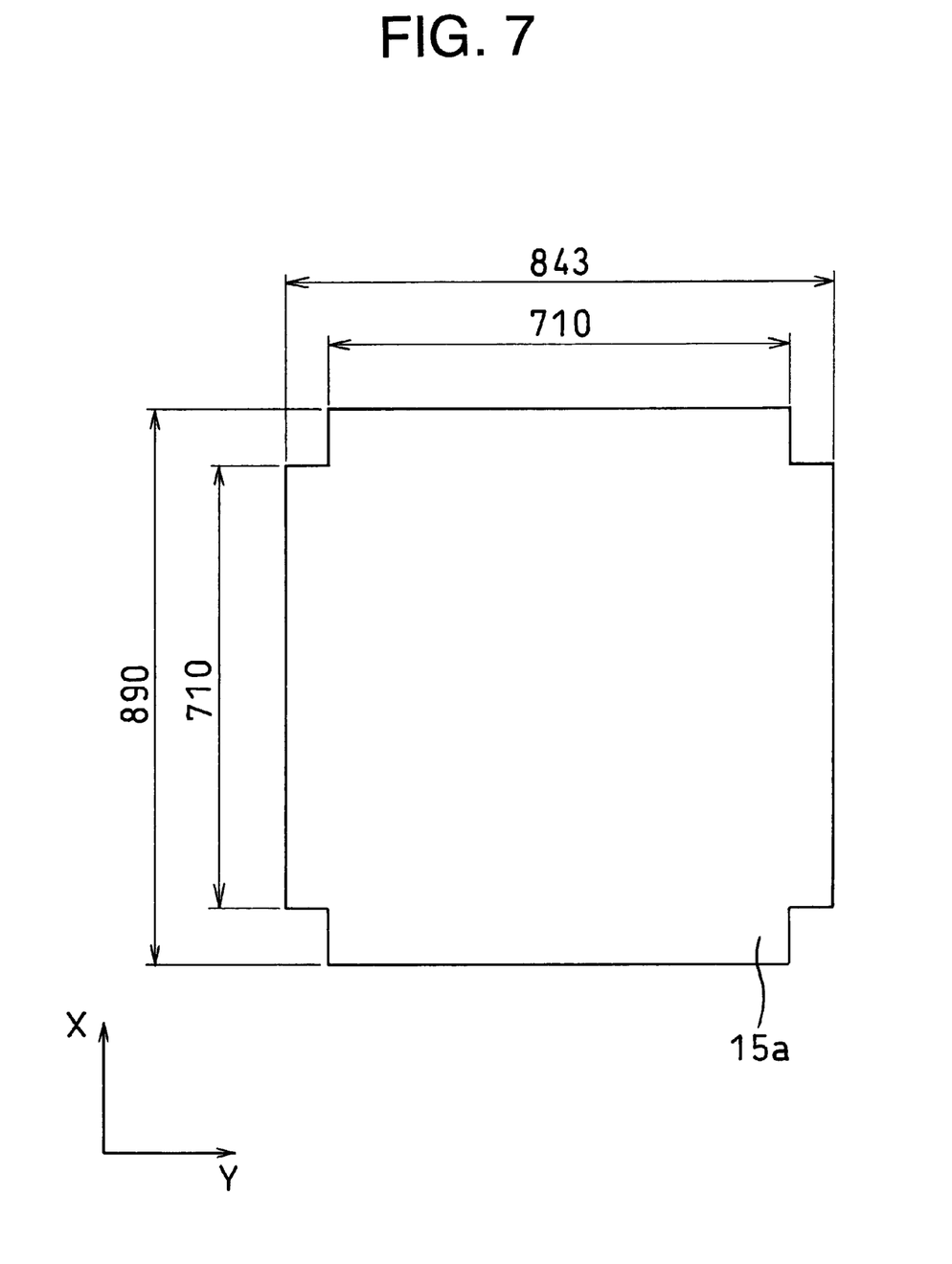
Figure 8:
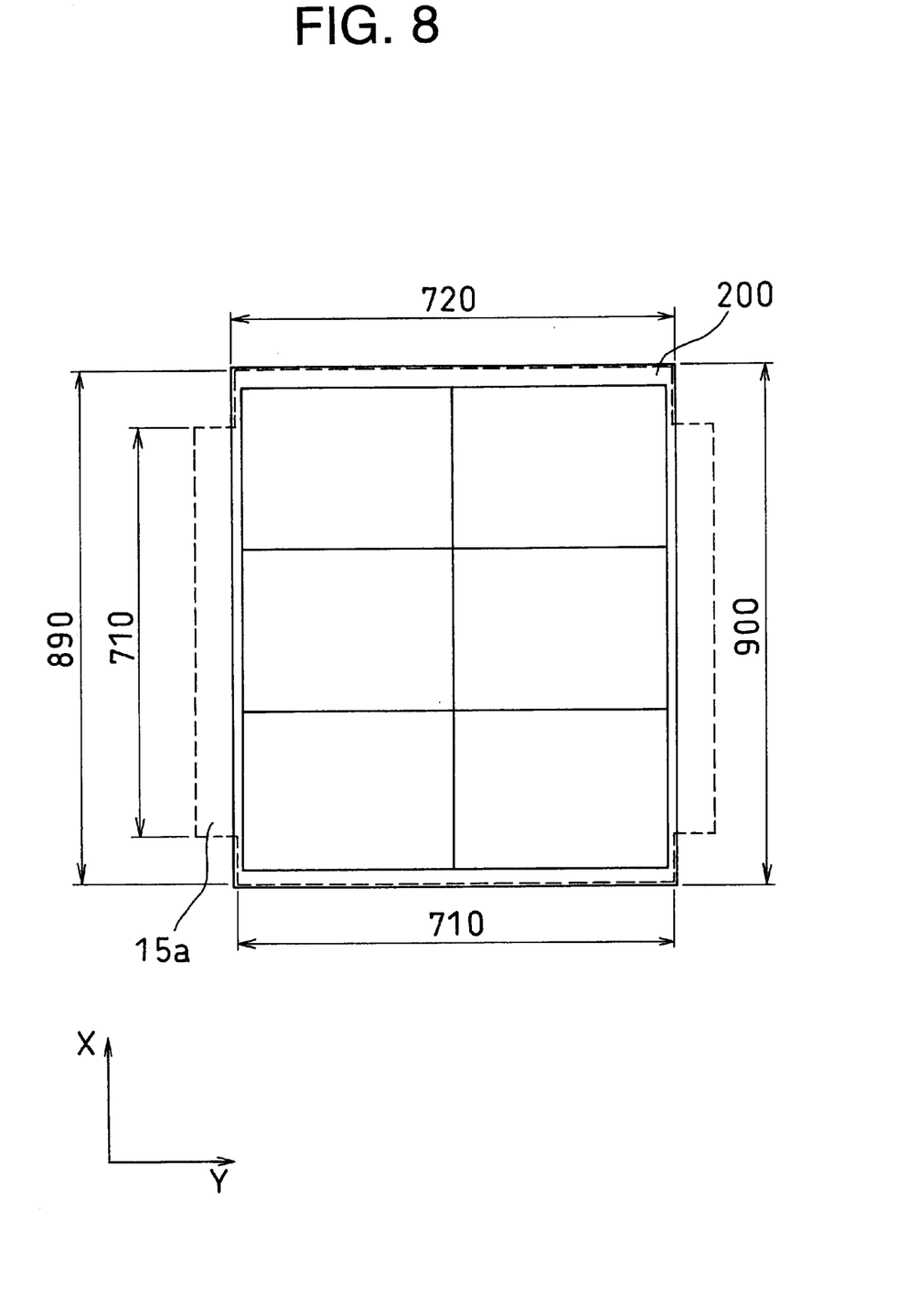

The size relationship is shown in FIGS. 7 and 8. FIGS. 7 and 8 are schematic views showing the sizes of a rectangular substrate holder 15a and a substrate 200 held by the substrate holder 15a (which is represented by dotted lines in FIG. 8 for distinction from the substrate 200), respectively. As shown in FIG. 8, the substrate 200 is loaded on the substrate holder 15a such that the longer sides of the substrate 200 are arranged along the longer sides of the substrate holder 15a.

Figure 9:
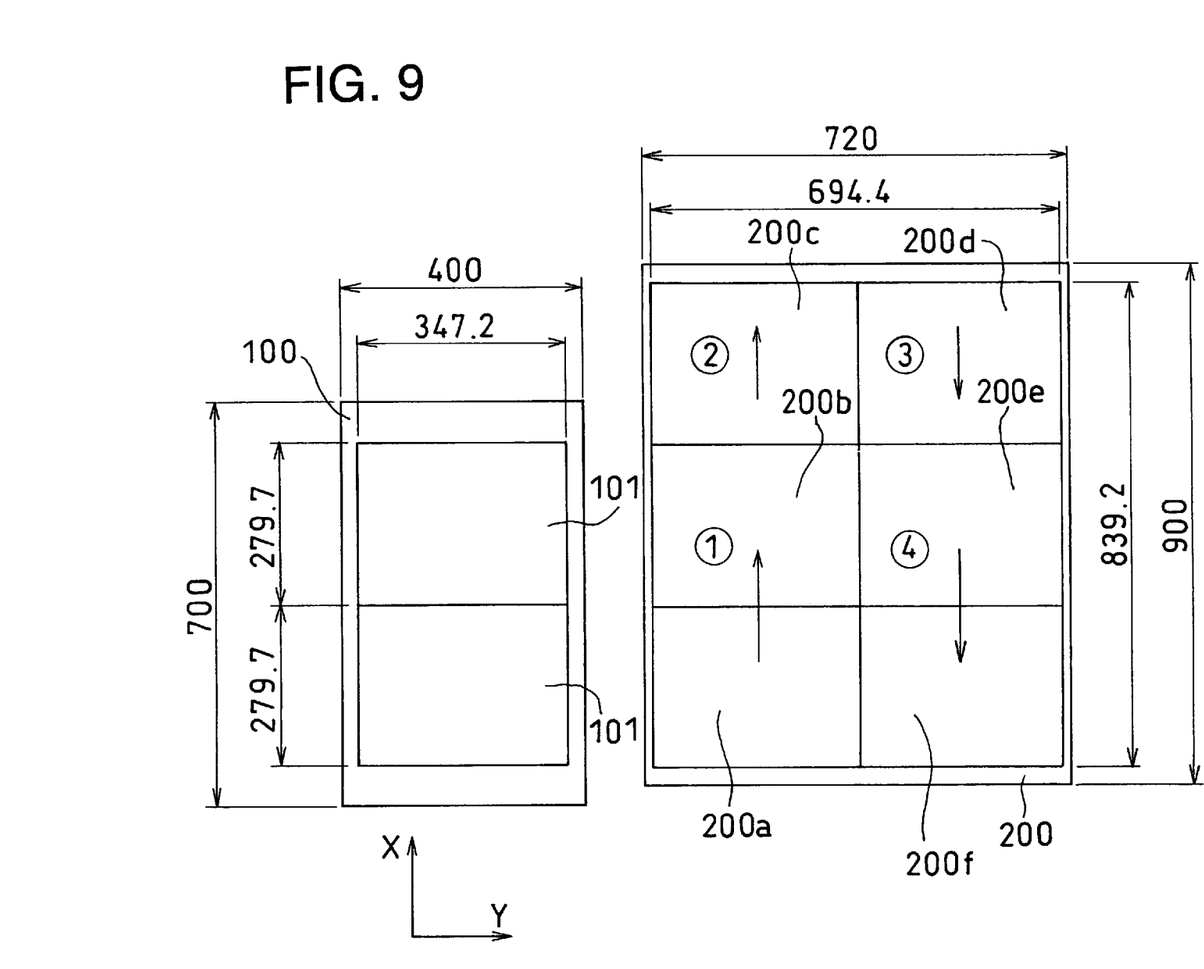
FIG. 9 is a schematic view for illustrating a manner of printing six 17-inch SXGA LCD panels on a substrate by using a mask 100 that has two 279.7 mm×347.2 mm circuit patterns 101 formed thereon.

FIG. 9 is a schematic view for illustrating a manner of printing six 17-inch SXGA panels on the above-described substrate by using a mask 100 that has two 279.7 mm×347.2 mm circuit patterns 101 formed thereon. In FIG. 9, the substrate holder 15a is omitted.

With reference to FIG. 9, an exposure of patterns of 17-inch SXGA liquid crystal display panels is carried out as follows. First, a first scanning exposure is conducted by synchronously transferring the mask 100 and the substrate 200 in the X-direction as indicated by an arrow 1 to print two circuit patterns 101 on exposure areas 200a and 200b of the substrate 200.

Then, the mask 100 and the substrate 200 are transferred back to the exposure initiating positions to perform a second scanning exposure to print a single circuit pattern 101 on an exposure area 200c as indicated by an arrow 2. Since the length of the side of the substrate 200 is 900 mm, two circuit patterns 101 cannot be exposed at the second scanning exposure.

Next, while the substrate 200 is step transferred in the Y-direction, the mask 100 and the substrate 200 are transferred back to the exposure initiating positions to perform a third scanning exposure to print a single circuit pattern 101 on an exposure area 200d of the substrate 200 as indicated by an arrow 3. Finally, two circuit patterns 101 are printed on exposure areas 200e and 200f as indicated by an arrow 4.

According to such a conventional exposure method, even when the mask 100 is provided with two circuit patterns 101, there is a case where only a single circuit pattern 101 can be printed at a time. As a result, the number of scanning exposure increases, limiting improvement of the throughput.

SUMMARY OF THE INVENTION

In view of the current situation of scanning exposure, the present invention has an objective of providing an exposure method which can be carried out with reduced number of scanning steps and at enhanced throughput.

According to the present invention, the above-mentioned objective is achieved by allowing a substrate to be placed in sideways (rotated by 900) with respect to a substrate holder (placing the longer sides of the substrate in parallel to the shorter sides of the substrate holder) depending on the size of the apparatus and the size of the substrate. When the substrate is placed in sideways with respect to the scanning direction, or the substrate holder, it is acceptable even when areas other than an effective exposure area of the substrate should project out from the substrate holder, since there is no need of precisely controlling flatness of areas of the substrate where they are not exposed to a pattern.

Along with the reference numerals, the present invention is an exposure method for exposing a rectangular substrate (14) to a pattern (30a) of a mask (30) by transferring a mask stage (20) carrying a mask (30) formed with the pattern (30) and a rectangular substrate holder (15a) carrying the substrate (14) in a first direction (X-direction), the method comprising: a step (S22) of placing the substrate (14) whose longer sides are longer than the shorter sides of the substrate holder (15a), on the substrate holder (15a) such that the longer sides of the substrate (14) are generally arranged along the shorter sides of the substrate holder (15a); a step (S25) of exposing a first area (14a, 14b) of the substrate (14) to the pattern (30a) of the mask (30) by transferring the mask stage (20) and the substrate holder (15a) in the first direction (X-direction); a step (S26) of transferring the substrate holder (15a) in a second direction (Y-direction) which is generally perpendicular to the first direction (X-direction); and a step (S27) of exposing a second area (14c, 14d) of the substrate (14), which is adjacent to the first area (14a, 14b) along the second direction (Y-direction), by transferring the mask stage (20) and the substrate holder (15a) in the first direction (X-direction).

According to the exposure method of the present invention, the number of scanning steps can be reduced, thereby realizing high throughput.

The exposure method of the invention can comply with the recent tendency toward enlargement of the substrate size, and can be applied without enlarging the exposure apparatus. For example, the exposure method of the invention is applicable to a substrate whose shorter side is 680 mm or longer and whose longer side is 880 mm or longer.

The first direction (X-direction) may be parallel to the longer sides of the substrate holder (15a). The first (14a, 14b) and second (14c, 14d) areas are positioned in a region where the substrate (14) is making contact with the substrate holder (15a). Alignment marks are preferably formed in a region where the substrate (14) is making contact with the substrate holder (15a).

BRIEF DESCRIPTION OF THE DRAWINGS

FIG. 4 is a schematic plan view showing a substrate 14 supported by a substrate holder 15a;

FIG. 7 is a schematic view showing a size of the substrate holder 15a;

FIG. 8 is a schematic view showing a substrate 200 loaded on the substrate holder 15a.

DESCRIPTION OF THE PREFERRED EMBODIMENTS

Hereinafter, embodiments of the present invention will be described with reference to the accompanying drawings.

Figure 1:
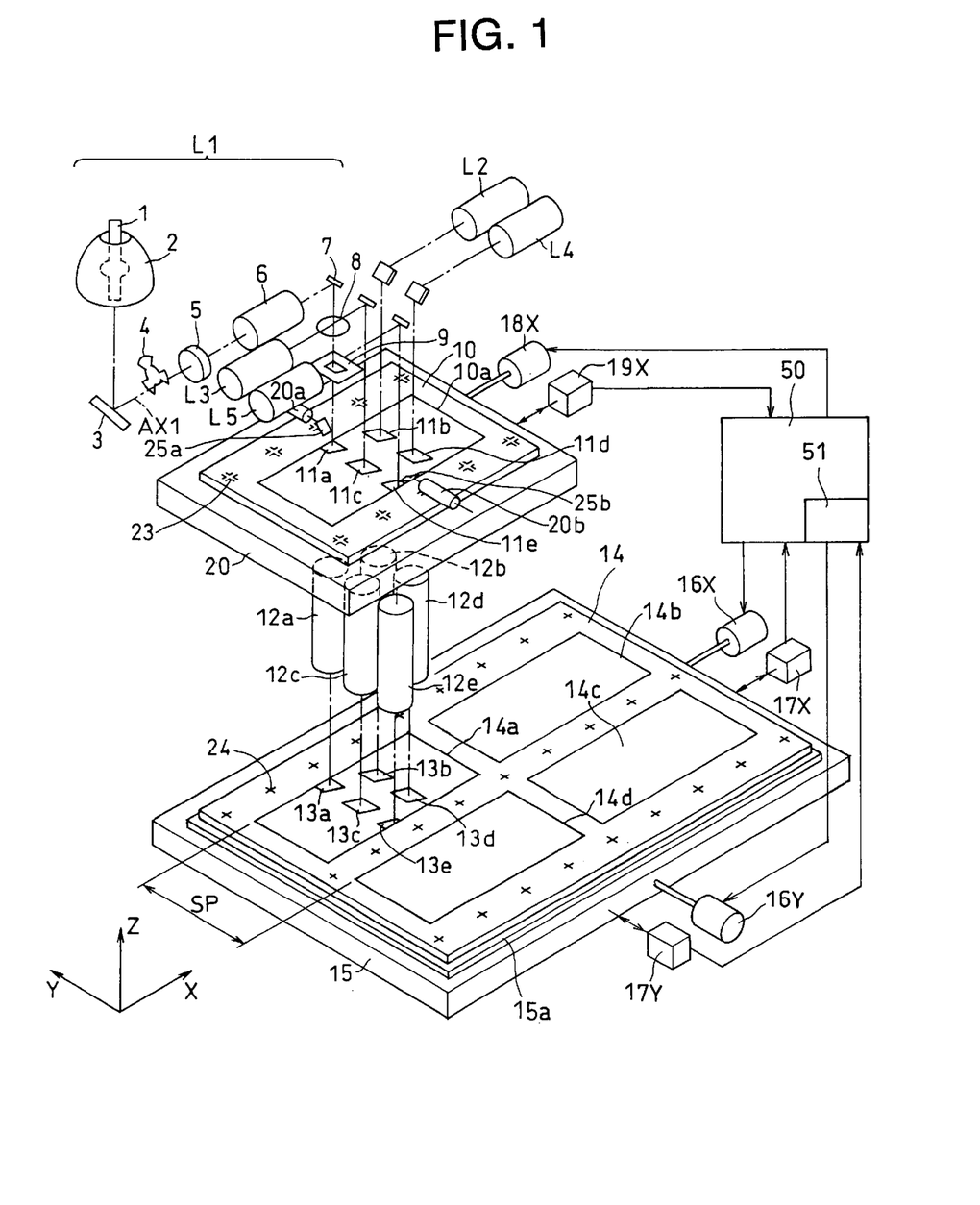
FIG. 1 is a schematic view showing a structure of a scanning-type exposure apparatus according to an embodiment of the invention.

FIG. 1 is a schematic view showing an exemplary structure of a scanning-type exposure apparatus used in a method of the invention. The scanning-type exposure apparatus employs a step-and-scan system using a mask 10 which is smaller than a substrate 14 (a glass plate applied with a photosensitive agent such as a photoresist) to print a pattern drawn on the mask 10 on the substrate 14 for several times. Herein, an effective exposure area of the mask 10 is 400 mm×700 mm, and the size of the substrate 14 is 720 mm×900 mm.

An active matrix liquid crystal panel requires a plurality of pattern layers to be overlaid during the fabrication process in order to form active elements. Therefore, a plurality of masks are prepared which are used in turn for printing the overlaid patterns.

A light bundle emitted from a light source 1 such as an extra-high pressure mercury lamp is reflected off an oval mirror 2 and directed toward a dichroic mirror 3. The dichroic mirror 3 reflects the light bundle in a wavelength range necessary for exposure and transmits the light bundle in other wavelength ranges. A shutter 4 arranged with respect to the optical axis AX1 selectively controls the advance of the light bundle reflected off the dichroic mirror 3 to a following projection optical system. When the shutter 4 is open, the light bundle enters into a wavelength selection filter 5 which outputs a light bundle with a wavelength (usually, at least one of band ranges of G-, H- and I-lines) suitable for the projection optical system 12a to print. An intensity distribution of this light bundle is of a Gaussian type where intensity is the highest in the vicinity of the optical axis and becomes lower toward the periphery. Therefore, the intensity has to be made uniform at least within a projection region 13a made by the projection optical system 12a. The intensity of the light bundle is made uniform with a flys' eye lens 6 and a condenser lens 8. A mirror 7 which bends the light is provided as a matter of device arrangement.

The light bundle with a uniformly-distributed intensity proceeds to a pattern plane of the mask 10 via a field stop 9. The field stop 9 has an opening for defining the projection region 13a on the substrate 14. Optionally, a lens system can be provided between the field stop 9 and the mask 10 such that the field stop 9, the pattern plane of the mask 10 and a projection plane of the substrate 14 conjugate with each other.

The structure from the light source 1 to the field stop 9 is referred to as an illuminating optical system L1 for the projection optical system 12a. Herein, illuminating optical systems L2 to L5 having the same structure as the illuminating optical system L1 are provided to supply light bundles to projection optical systems 12b to 12e, respectively. Light bundles outcoming from the multiple illuminating optical systems L1 to L5 illuminate respective regions (illuminated areas) 11a to 11e on the mask 10. The plurality of light bundles that passed through the mask 10 form pattern images of the illuminated areas 11a to 11e of the mask 10 on respective projection regions 13a to 13e of the substrate 14 via the projection optical systems 12a to 12e corresponding to the respective illuminating optical systems L1 to L5. The projection optical systems 12a to 12e all form erect real images (erect normal images) at one to one magnification. In FIG. 1, the direction of optical axes of the projection optical systems 12a to 12e is referred to as Z-direction. The direction of scanning the mask 10 and the substrate 14 (perpendicular to the Z-direction) is referred to as X-direction (a first direction). The direction perpendicular to both Z- and X-directions is referred to as Y-direction (a second direction).

The substrate 14 is adsorbed (e.g., by vacuum holding) on the substrate holder 15a on a substrate stage 15. According to this embodiment, the size of the rectangular substrate holder 15a is 843 mm×890 mm which is equivalent to the size of the prior art substrate holder shown in FIG. 7.

The substrate stage 15 has an X-direction driving device 16X which gives a long stroke along the scanning direction (X-direction) for one-dimensional scanning exposure. The substrate stage 15 also has a highly-accurate high-resolution X-direction position detecting device (e.g., a laser interferometer) 17X with respect to the scanning direction. The mask 10 is supported by a mask stage 20 which, similar to the substrate stage 15, also has an X-direction driving device 18X which gives a long stroke along the scanning direction (X-direction) and an X-direction position detecting device 19X for detecting the position of the mask stage 20 along the scanning direction.

Furthermore, the substrate stage 15 is capable of being step transferred in the Y-direction which is generally perpendicular to the X-direction (the scanning direction). Specifically, the substrate stage 15 is provided with a Y-direction driving device 16Y for driving the substrate stage 15 in the Y-direction, and a Y-direction position detecting device 17Y. The substrate stage 15 is step transferred by the Y-direction driving device 16Y for a distance SP which is longer than the length of the illuminated areas 11a to 11e along the Y-direction.

Figure 2:
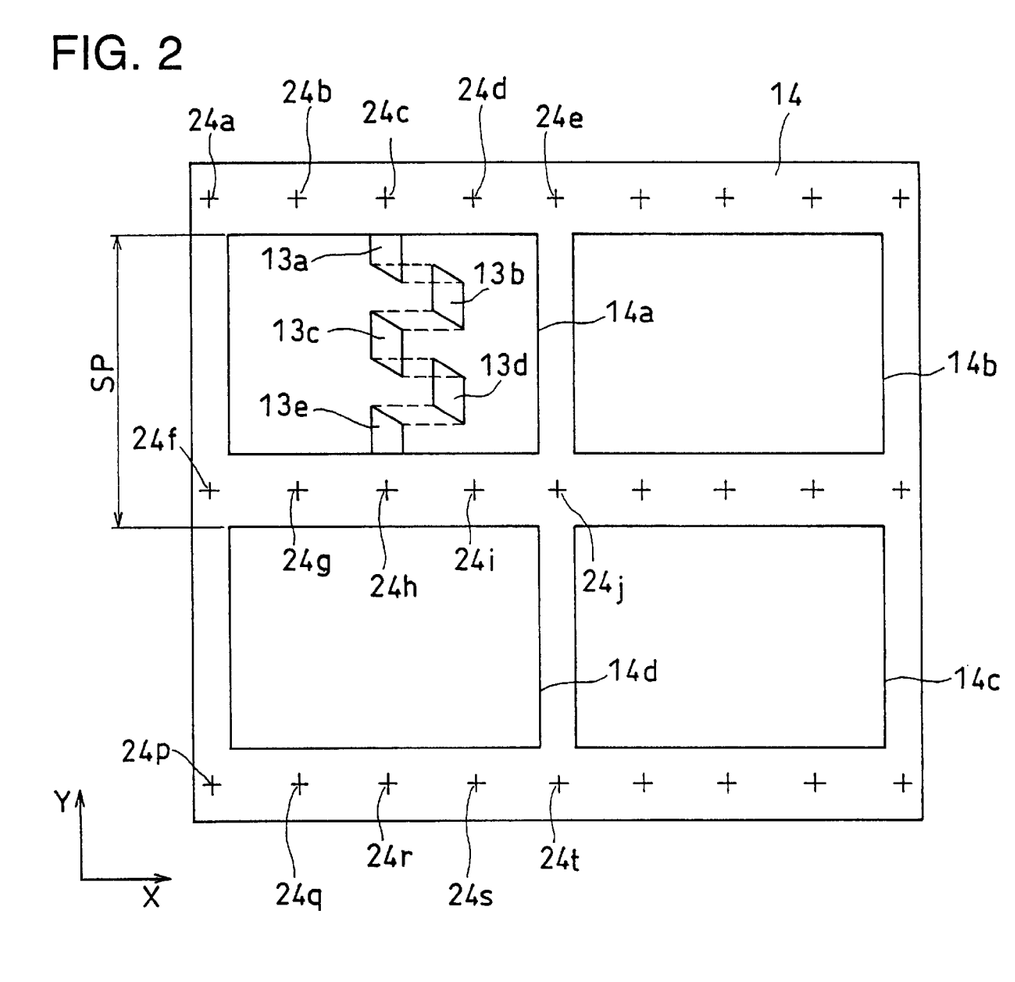
FIG. 2 is a plan view showing a substrate 14 loaded on a substrate stage 15.

FIG. 2 is a plan view showing a substrate 14 loaded on the substrate stage 15. As shown in FIG. 2, the projection regions 13a to 13c on the substrate 14 are arranged such that regions adjacent along the Y-direction (e.g., regions 13a and 13b, and regions 13b and 13c) are shifted for a predetermined length along the X-direction and the ends of the adjacent regions overlap along the Y-direction as represented by the dotted lines. Accordingly, in accordance with the projection regions 13a to 13e, the multiple projection optical systems 12a to 12e are also shifted for a predetermined distance along the X-direction while the adjacent ends thereof overlap along the Y-direction. Although the shapes of the projection regions 13a to 13e are parallelograms in the figure, they may be hexagons, rhombuses, trapezoids or the like. The multiple illuminating optical systems L1 to L5 are arranged such that the illuminated areas 11a to 11e on the mask 10 match with the above-described projection regions 13a to 13e. The substrate 14 is provided with alignment marks (substrate marks) 24a, 24b, 24c, . . . , 24f, 24g, 24h, . . . , 24p, 24q, 24r, . . . outside the exposure areas 14a, 14b, 14c and 14d.

Figure 3:
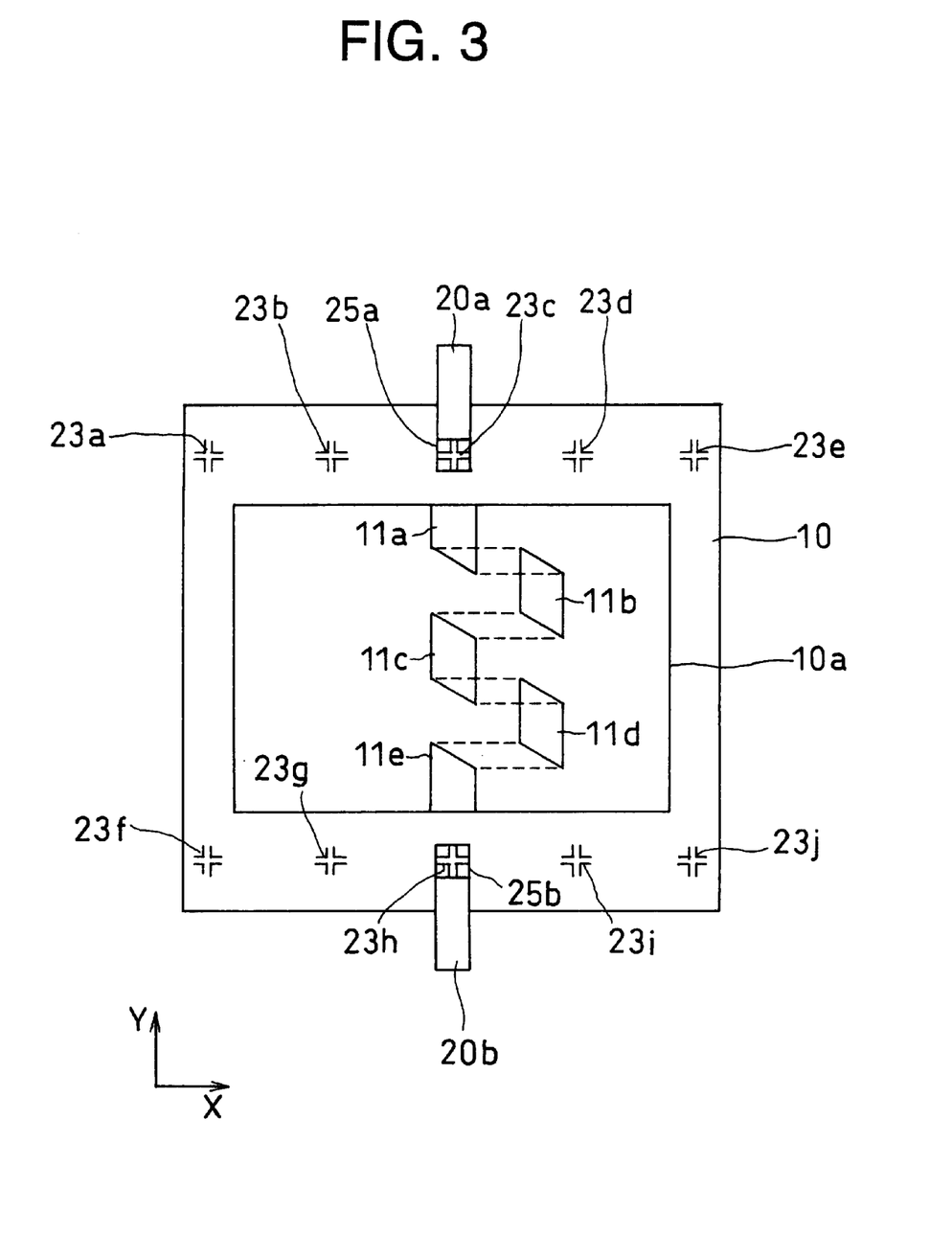
FIG. 3 is a plan view showing a mask 10.

FIG. 3 is a plan view of the mask 10 showing a pattern region 10a having a pattern to be printed on the substrate 14. Outside the pattern region 10a, the mask 10 is provided with alignment marks (mask marks) 23a to 23j corresponding to the substrate marks 24a, 24b, 24c, . . . , 24f, 24g, 24h, . . . , 24p, 24q, 24r, . . . on the substrate 14.

As can be appreciated from FIGS. 1 and 3, the alignment systems 20a and 20b are provided above the mask 10, for detecting the mask marks 23a to 23j on the mask 10 as well as the substrate marks 24a, 24b, 24c, . . . , 24f, 24g, 24h, . . . , 24p, 24q, 24r, . . . formed on the substrate 14, via the projection optical systems 12a and 12e. Specifically, light beams outcoming from the alignment systems 20a and 20b are directed toward the mask marks 23a to 23j formed on the mask 10 via the reflecting mirrors 25a and 25b, and toward the substrate marks 24a, 24b, 24c, . . . , 24f, 24g, 24h, . . . (24f, 24g, 24h, . . . , 24p, 24q, 24r, . . . ) on the substrate 14 via the optical systems 12a and 12e at both ends of the multiple projection optical systems 12a to 12e.

The light reflected off the substrate marks 24a, 24b, 24c, . . . , 24f, 24g, 24h, . . . (24f, 24g, 24h, . . . , 24p, 24q, 24r, . . . ) formed on the substrate 14 is directed to the alignment systems 20a and 20b via the projection optical systems 12a and 12e and the reflecting mirrors 25a and 25b. The light reflected off the mask marks 23a to 23j formed on the mask 10 is directed to the alignment systems 20a and 20b via the reflecting mirrors 25a and 25b. The alignment systems 20a and 20b detect the position of each alignment mark based on the reflected light from the mask 10 and the substrate 14.

While transferring the mask stage 20 and the substrate stage 15 along the X-direction, the alignment detection systems 20a and 20b simultaneously detect the substrate marks 24a, 24b, 24c, . . . , 24f, 24g, 24h, . . . ( 24f, 24g, 24h, . . . , 24p, 24q, 24r, . . . ) on the substrate 14 and the mask marks 23a to 23j on the mask 10, thereby detecting the relative positions of the substrate 14 and the mask 10.

The scanning-type exposure apparatus is capable of step transferring the substrate stage 15 along the Y-direction (which is generally perpendicular to the X-direction, or the scanning direction) for a distance SP which is at least longer than the width of the illuminated areas 11a to 11e along the Y-direction. After the scanning exposure by synchronously driving the mask stage 20 and the substrate stage 15 along the X-direction, the scanning exposure is performed once more or for several times by step transferring the substrate stage 15 along the Y-direction for a distance SP to print an array of multiple mask patterns 10a onto the large substrate 14.

Returning to FIG. 1, the controller 50 controls the whole scanning-type exposure apparatus, and is input with the measurement results from the position detecting devices 17X, 17Y and 19X as well as alignment outputs from the alignment systems 20a and 20b. The controller 50 is provided with a storage medium 51.

Hereinafter, a method will be described for exposing the substrate 14 to six 17-inch SXGA patterns, each having a size of 279.7 mm×347.2 mm including a circuit pattern surrounding a pixel region.

As described above, the size of the substrate holder 15a is 843 mm×890 mm and the size of the substrate 14 is 720 mm×900 mm, where the longer sides of the substrate 14 are longer than the shorter sides of the substrate holder 15a. Moreover, instead of the mask 10, a mask 30 is used which is printed with two 17-inch SXGA patterns 30a. The effective exposure area of the mask 30 is 400 mm×700 mm which is the same as that of the mask 10. The mask 30 is provided with mask marks (omitted in the figure) similar to those on the mask 10.

Figure 4:
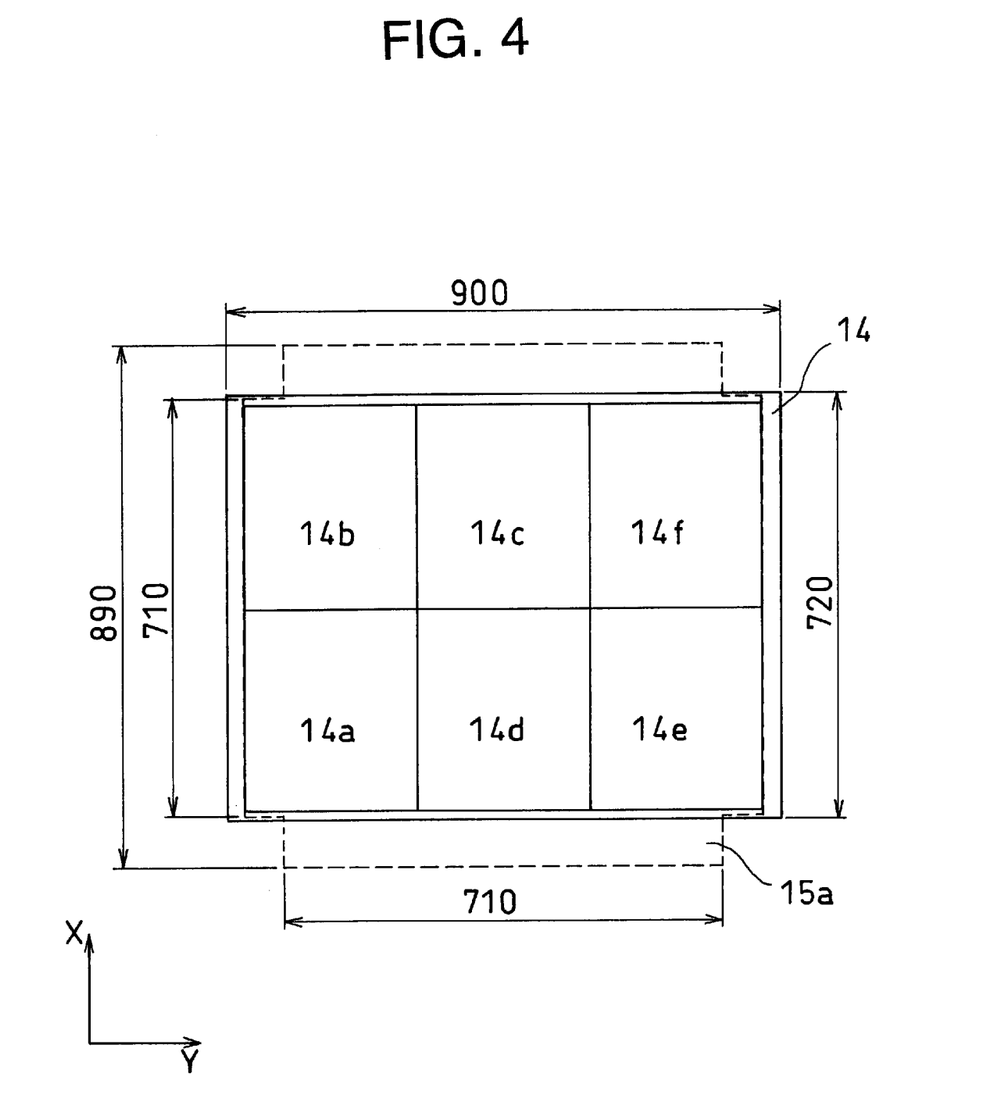

FIG. 4 is a schematic plan view showing a substrate 14 supported by the substrate holder 15a (which is represented by dotted lines in FIG. 4 for distinction from the substrate 14).

As shown in FIG. 4, in order to expose the substrate 14 to the 17-inch SXGA patterns, the substrate 14 is loaded on the substrate holder 15a such that the longer sides of the substrate 14 are in parallel to the shorter sides of the substrate holder 15a (i.e., the substrate 14 is rotated by 900 from the position shown in FIG. 1).

Although the ends of the longer sides of the substrate 14 project out from the substrate holder 15a, the exposure areas 14a to 14f of the substrate 14 are supported by (in contact with) the substrate holder 15a via the above-described vacuum holding. Since the flatness of the exposure areas 14a to 14f of the substrate 14 is precisely maintained by vacuum holding, the patterns 30a of the mask 30 can accurately be printed onto the exposure areas 14a to 14f of the substrate 14. Although they are not shown in the figure, alignment marks are formed on the substrate 14 at positions corresponding to the vacuum holding regions of the substrate holder 15a for alignment of the substrate 14.

Figure 5:
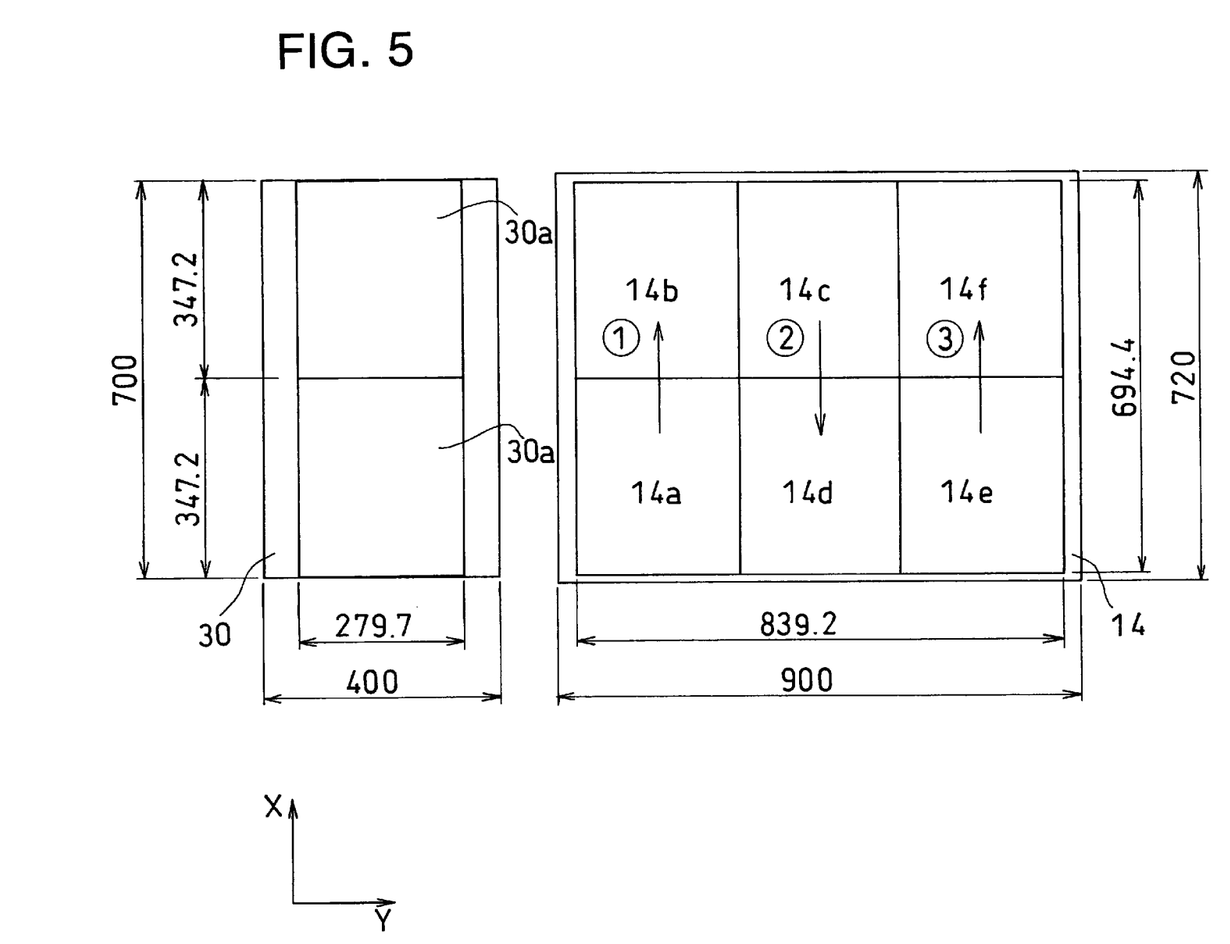
FIG. 5 is a schematic plan view showing a manner of printing six 17-inch SXGA LCD panels on the substrate 14 by using a mask 30 that has two 347.2 mm×279.7 mm circuit patterns 30a formed thereon.

FIG. 5 is a schematic plan view showing a method for printing six 17-inch SXGA panels on the substrate 14, by using a mask 30 that has two 347.2 mm×279.7 mm circuit patterns 30a formed thereon. In FIG. 5, the substrate holder 15a is omitted.

As shown in FIG. 5, the size of the mask 30 is the same as that of the prior art mask 100, although the direction of the pattern 30a is shifted by 900 from that of the pattern 101 of the mask 100. In other words, the longer sides of the pattern 30a of the mask 30 are in parallel to the longer sides of the mask 30.

Figure 6:
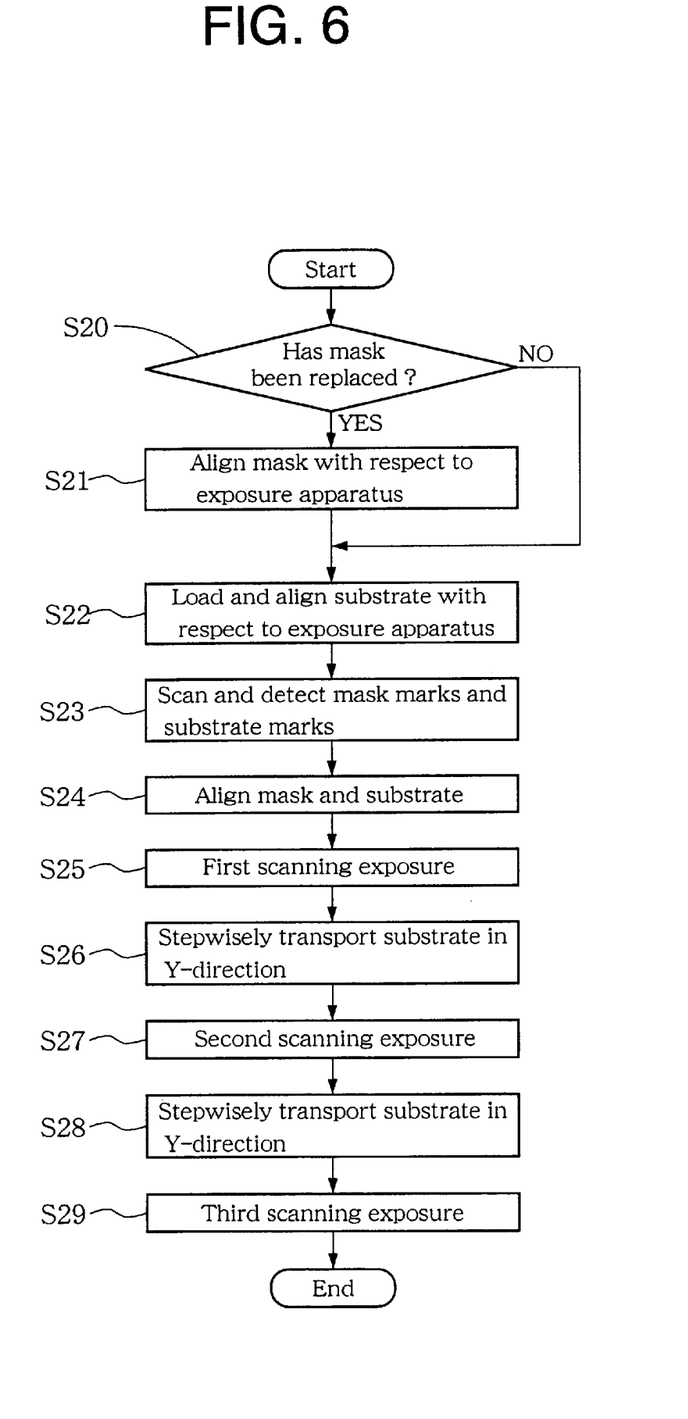
FIG. 6 is a flowchart showing an exemplary sequence of steps for scanning exposure.

Hereinafter, an exemplary sequence of steps for scanning exposure with the controller 50 will be described with reference to the flowchart shown in FIG. 6.

The controller 50 controls a mask loader (not shown) to replace the mask 10 on the mask stage 20 with the mask 30 which is provided with two 17-inch SXGA patterns 30a (Step 20).

When the answer in Step 20 is "YES", the controller 50 proceeds to Step 21 to align the mask 30 with respect to the exposure apparatus, using the alignment systems 20a and 20b supported by a supporting member supporting the projection optical systems 12a to 12e. The alignment systems 20a and 20b perform the alignment by adjusting the position of the mask stage 20 such that the positions of the mask marks are in a predetermined relationship with the index marks in the alignment systems 20a and 20b (Step 21). When there is no need of replacing the mask, Step 21 is omitted.

Next, the controller 50 loads the substrate 14 that is to be exposed onto the substrate holder 15a on the substrate stage 15 by using a substrate loader (not shown), and positions the loaded substrate 14 with respect to the exposure apparatus such that the longer sides of the substrate 14 are in parallel to the shorter sides of the substrate holder 15a (Step 22). Specifically, similar to the alignment of the mask 30 at Step 21, the substrate stage 15 is driven by detecting the substrate marks with the alignment systems 20a and 20b such that the positions of the substrate marks are in a predetermined relationship with the index marks in the alignment systems 20a and 20b.

The controller 50 synchronously scans the mask 30 and the substrate 14 with respect to the projection optical systems 12a to 12e by driving the mask stage 20 and the substrate stage 15, for example, in the −X-direction, by the X-direction driving device 18X for the mask stage 20 and the X-direction driving device 16X for the substrate stage 15. One of the alignment systems 20a and 20b detects relative positions of the mask marks and the substrate marks upon synchronous scanning. The relative positions of the detected mask marks and the substrate marks upon synchronous scanning are stored in the storage medium 51 (Step 23).

After the mask 30 and the substrate 14 are scanned, the mask 30 and the substrate 14 are aligned at the scan initiating positions where the mask 30 and the substrate 14 are completely dislocated from the illuminated areas 11a to 11e and the projection regions 13a to 13e, respectively (Step 24). The alignment at Step 24 is performed by calculating, by the least square method, the transportation distances of the mask 30 in the X-direction, Y-direction and the rotation direction such that the relative position errors between the mask marks and the corresponding substrate marks (which are detected during the scanning at Step 23 and stored in the storage medium 51) are minimum, and in accordance with the results, by adjusting the position of the mask 30 on the mask stage 20.

The controller 50 prints the two patterns 30a of the mask 30 on the projection regions 14a and 14b of the substrate 14 as represented by the arrow 1 in FIG. 5 by the first scanning exposure where the mask stage 20 and the substrate stage 15 are synchronously scanned in the +X-direction (Step 25).

After the first scanning exposure, the controller 50 drives the Y-direction driving device 16Y to stepwisely transport the substrate 14 in the Y-direction. The distance of a single step transportation is generally equal to the length of the shorter side of the 17-inch SXGA LCD panel (279.7 mm in the figure) (Step 26).

The controller 50 prints the two patterns 30a of the mask 30 on the projection regions 14c and 14d of the substrate 14 as represented by the arrow 2 in FIG. 5 by the second scanning exposure where the mask stage 20 and the substrate stage 15 are synchronously scanned in the −X-direction (Step 27).

After the second scanning exposure, the controller 50 drives the Y-direction driving device 16Y to stepwisely transport the substrate 14 in the Y-direction. The distance of a single step transportation is the same as Step 26 and is generally equal to the length of the shorter side of the 17-inch SXGA LCD panel (279.7 mm in the figure) (Step 28).

The controller 50 prints the two patterns 30a of the mask 30 on the projection regions 14e and 14f of the substrate 14 as represented by the arrow 3 in FIG. 5 by the third scanning exposure where the mask stage 20 and the substrate stage 15 are synchronously scanned in the +X-direction (Step 25).

When six 17-inch SXGA LCD panels are to be printed, the prior art required scanning exposures for four times. On the other hand, according to the embodiment of the present invention, six 17-inch SXGA LCD panels can be printed by scanning exposures for three times since the substrate 14 is loaded on the substrate holder 15a such that the longer sides of the substrate 14 are arranged in parallel to the shorter sides of the substrate holder 15a.

In order to simplify the description of the present embodiment, the sizes of the mask 30, the substrate 14 and the substrate holder 15a are specialized herein. The present embodiment, however, is not limited to these sizes and can broadly be applied to devices of various sizes as long as the substrate holder 15a is loaded on the substrate 14 such that the longer sides of the substrate 14 are arranged in parallel to the shorter sides of the substrate holder 15a.

According to the present invention, scanning exposure can be carried out with reduced number of scanning steps and at enhanced throughput without enlarging the exposure apparatus including a substrate holder, by allowing a substrate to be placed with respect to the substrate holder such that the longer sides of the substrate are in parallel to the shorter sides of the substrate holder depending on the size of the apparatus and the size of the substrate.

What is claimed is:

1. An exposure method for exposing a rectangular substrate to a pattern of a mask by transferring a mask stage carrying a mask formed with the pattern and a rectangular substrate holder carrying the substrate in a first direction, the method comprising the steps of:

placing the substrate whose longer sides are longer than the shorter sides of the substrate holder, on the substrate holder such that the longer sides of the substrate are generally arranged along the shorter sides of the substrate holder;

exposing a first area of the substrate to the pattern of the mask by transferring the mask stage and the substrate holder in the first direction;

transferring the substrate holder in a second direction which is generally perpendicular to the first direction; and exposing a second area of the substrate, which is adjacent to the first area along the second direction, by transferring the mask stage and the substrate holder in the first direction.

2. An exposure method according to claim 1, wherein the shorter side of the substrate has a length of at least 680 mm and the longer side of the substrate has a length of at least 880 mm.

3. An exposure method according to claim 1, wherein the first direction is parallel to the longer sides of the substrate holder.

4. An exposure method according to claim 1, wherein the first and second areas are positioned in a region where the substrate is making contact with the substrate holder.

5. An exposure method according to claim 1, further comprising a step of forming alignment marks used for alignment of the substrate, in a region where the substrate is making contact with the substrate holder.

* * * * *